(12) United States Patent
Cho et al.

(10) Patent No.: US 6,870,766 B2
(45) Date of Patent: Mar. 22, 2005

(54) MULTI-LEVEL FLASH MEMORY WITH TEMPERATURE COMPENSATION

(75) Inventors: Tae-Hee Cho, Kyunggi-do (KR); Yeong-Taek Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 186 days.

(21) Appl. No.: 10/300,485

(22) Filed: Nov. 19, 2002

(65) Prior Publication Data

US 2003/0189856 A1 Oct. 9, 2003

(30) Foreign Application Priority Data

Apr. 4, 2002 (KR) ........................................ 2002-18448

(51) Int. Cl.[7] ........................ G11C 16/04; G11C 06/06
(52) U.S. Cl. ........................ 365/185.03; 365/185.2; 365/185.21; 365/185.22
(58) Field of Search ...................... 365/185.03, 185.18, 365/185.2, 185.21, 185.22

(56) References Cited

U.S. PATENT DOCUMENTS

| | | | | |
|---|---|---|---|---|
| 5,864,504 A | * | 1/1999 | Tanzawa et al. | 365/185.22 |
| 6,349,060 B1 | * | 2/2002 | Ogura | 365/185.22 |
| 6,667,904 B2 | * | 12/2003 | Takeuchi et al. | 365/185.03 |

* cited by examiner

*Primary Examiner*—Trong Phan
(74) *Attorney, Agent, or Firm*—Marger Johnson & McCollom, P.C.

(57) ABSTRACT

A multi-level semiconductor memory device preferably includes a plurality of wordlines connected to memory cells configured to store multi-level data. A first circuit supplies a temperature-responsive voltage to a selected wordline in order to read a state of a selected memory cell. A second circuit supplies a predetermined voltage to non-selected wordlines. The first circuit preferably includes a semiconductor element that varies its resistance in accordance with temperature. Reliable program-verifying and reading functions are preferably provided despite migration of threshold voltage distribution profiles due to temperature variations.

16 Claims, 15 Drawing Sheets

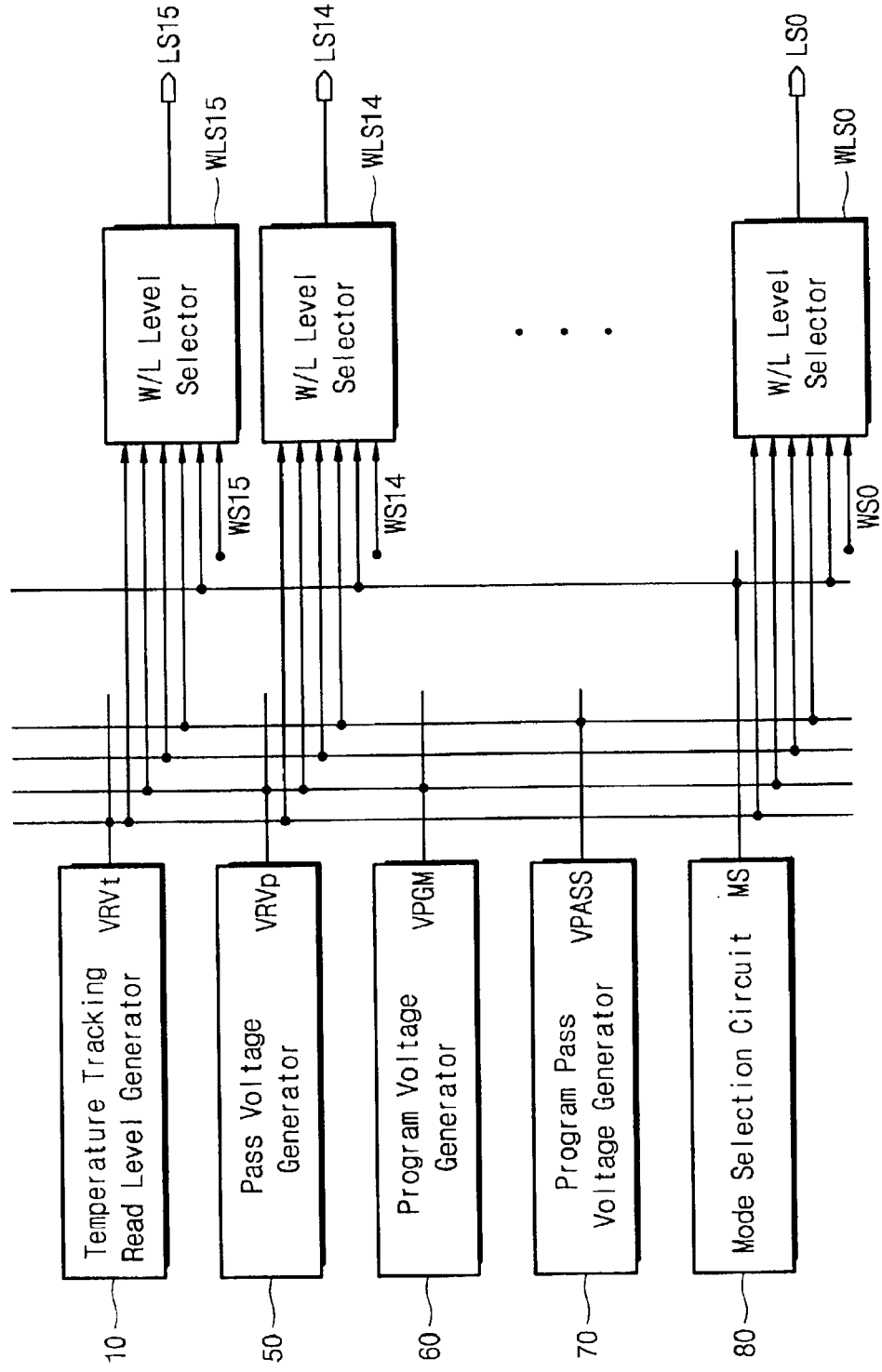

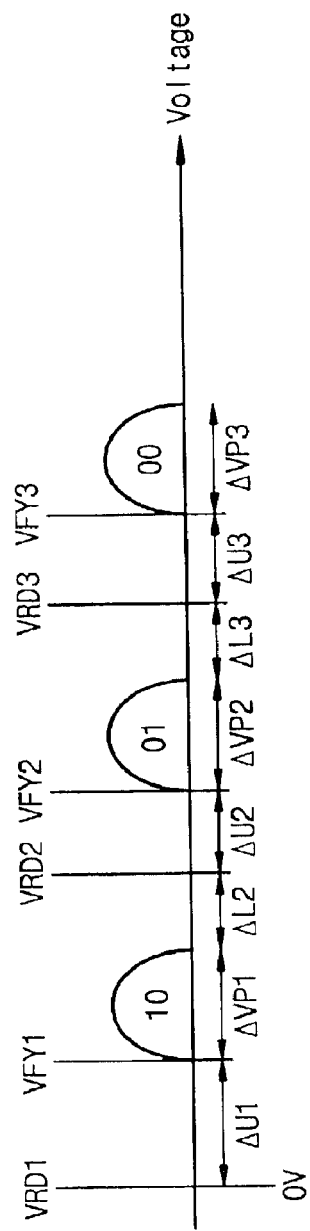
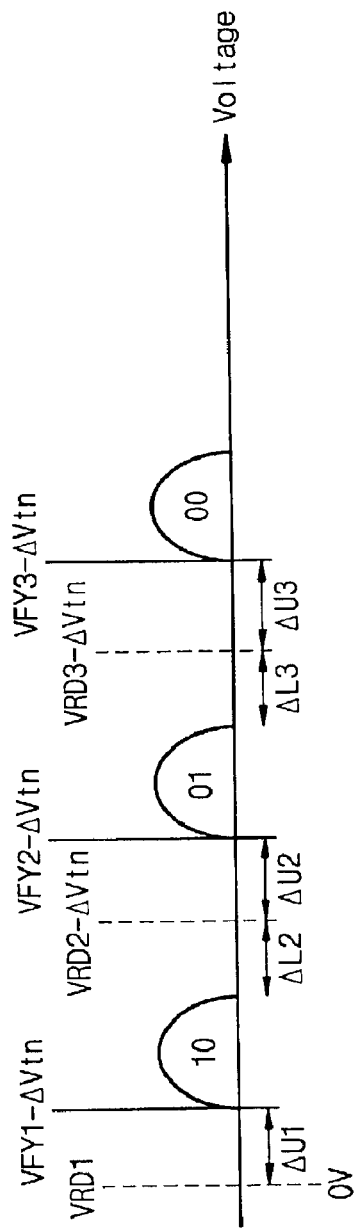

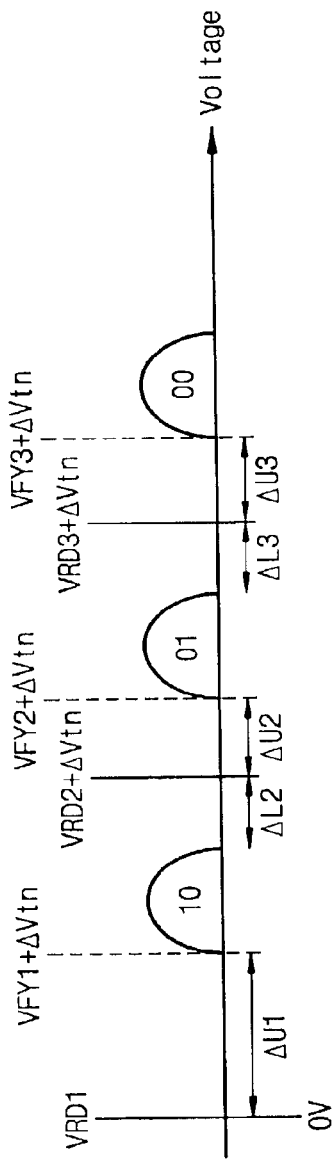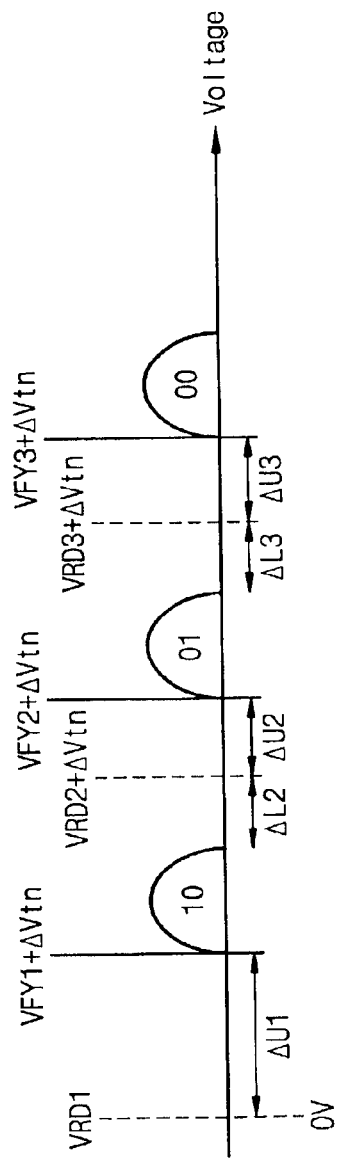

MULTI-LEVEL FLASH MEMORY WITH TEMPERATURE COMPENSATION

This application claims priority from Korean Patent Application 2002-18448, the contents of which are incorporated herein by reference in their entirety.

BACKGROUND OF THE INVENTION

1. Field of the Invention

The present invention relates generally to flash memory devices and, more specifically, to multi-level flash memory devices.

2. Description of Related Art

Flash memories (e.g., flash EEPROMs) are useful as subsidiary storage elements because they are capable of providing a large memory capacity with a higher degree of integration than traditional EEPROMs. NAND-type flash memories, in particular, typically have a higher integration density than other types of flash memories such as NOR- or AND-types. A memory cell of a flash memory is typically constructed by forming source and drain regions in a semiconductor substrate, forming a thin oxide film on the surface of the substrate between the source and drain regions, and then forming a floating gate, an interlayer oxide film, and a control gate on the substrate, in that order.

The NAND-type flash memory has several operation modes, including programming, erasing, and reading. The erasing and programming modes operate using a voltage difference between the floating gate and the substrate (or bulk). An erased memory cell is one in which electrons have moved to the floating gate from the substrate. When a read voltage is applied to an erased memory cell, current flows through the cell and it is detected as a logical "1". A programmed memory cell, on the other hand, is one in which electrons have moved into the substrate from the floating gate. Programmed cells therefore have a higher threshold voltage than the erased cells and are detected as a logical "0".

A multi-level flash memory provides additional data storage capacity using the same number of memory cells. Referring to FIG. 1, in a flash memory storing two bits per memory cell, there are four different possible distribution profiles of threshold voltages corresponding to logic states of "11", "10", "01", and "00". The "11" logic state, for example, corresponds to an erased state. Referring to FIG. 2, a multi-level flash memory can use a pair of latch circuits to load and sense the two data bits.

Referring to FIGS. 1 and 3A, in programming the two bits of the memory cell into one of the four data states, the wordline voltage W/Lm (m=1, 2, 3, . . . 15) sequentially steps up from VPGM1 ("10") to VPGM2 ("01") to VPGM3 ("00"), through repeated program cycles. In each program cycle, a program-verifying operation is carried out after completing the programming (or writing). As shown in FIG. 1, each program-verifying voltage VFYn−1 (where n=the number of data states (i.e., 4)) is set to the lowest position in each threshold distribution profile, while each reading voltage VRDn−1 is arranged at an intermediate position between the threshold distribution profiles.

FIG. 2 shows a number of memory strings in parallel, respectively connected to bit lines, BL1, BL2, BL3, and BL4, and also connected to a common source line CSL. Each memory string is controlled by a string select line SSL and a ground select line GSL. The two latch circuits in FIG. 2, LM and LL, are respectively assigned to the most significant bit (MSB) (e.g., "1" of "10") and the least significant bit (LSB) (e.g., "0" of "10"). Outputs QM, QL of the latch circuits change in order of LSB-MSB-LSB during the programming and reading modes. The programming mode is operable with second and third latch control signals LTH2, LTH3, as in FIG. 3A, which are alternately active with high-leveled pulses, while a first latch control signal LTH1 is held at a low level. Latch selection signals SEL1, SEL2 also alternate in correspondence with their bits during every program/verifying cycle. The LSB latch node QL provides an output of the LSB latch circuit LL and always responds to a state of the MSB latch circuit LM when the LSB varies.

Referring now to FIG. 3A, during the programming mode, a program-inhibit state is entered while both latch outputs QM, QL are "1" (i.e., a "11" data state) to charge non-selected bitlines up to a power supply voltage (VCC) level. First, when programming the data state "10", which is associated with the lowest threshold voltage, data bits "1" and "0" are loaded into the MSB and LSB latch nodes QM, QL, denoted in FIG. 3A as QM1 and QL0, respectively. The program voltage VPGM1 is then applied to a selected wordline (e.g., a control gate WL15 of a selected memory cell M), so that the selected memory cell M is forced to have its threshold voltage within the profile ΔVP1 of FIG. 1. The bitline BL1, shown in FIG. 2, is then set to a VSS level.

Following these steps, a program-verifying voltage VFY1 is applied to the selected wordline WL15 to evaluate whether the memory cell M has a threshold voltage within the profile of the data state "10". If the threshold voltage of the memory cell M is within ΔVP1, the memory cell M is turned on in response to the program-verifying voltage VFY1 and the LSB latch output QL is thereby changed to "1" from "0". The transition of the LSB latch output QL to "1" requires that the MSB latch output QM of "1" is coupled to the gate of the fourteenth NMOS transistor N14 and that a high level second latch control signal LTH2 is coupled to the gate of the fifteenth NMOS transistor N15.

Next, in programming the selected memory cell M into the data state "01", a second program voltage VPGM2, which is higher than the first program voltage VPGM1, is applied to the memory cell M after programming it to the data state "10". Data bits "0" and "1" are each loaded into the MSB and LSB outputs QM, QL, denoted in FIG. 3A as QM0 and QL1, respectively, and the first latch selection signal SEL1 is activated to supply a VSS voltage level to the first bitline BL1. After completing the second programming, if the threshold voltage of the selected memory cell M moves into the distribution profile ΔVP2 from ΔVP1, of FIG. 1, the second program-verifying voltage VFY2 changes the MSB latch output QM to "1" when the third latch control signal LTH3 is enable with a high-level pulse.

Finally, when programming the selected memory cell M into the data state "00", the third program voltage VPGM3, which is higher than the second program voltage VPGM2, is applied to the selected memory cell M after programming it to the data state "01" (e.g., from "10" to "01"). At this time, the MSB latch output QM retains a value of "0", which was set when programming "01", and a newly loaded data bit "0" is transferred to the first bitline BL1. After completing the third programming, if the threshold voltage of the selected memory cell M moves into the distribution profile ΔVP3 from ΔVP2, of FIG. 1, the third program-verifying voltage VFY3 changes the LSB output QL to "1" when the second latch control signal LTH2 is enabled with a high-level pulse. During program-verifying, the LSB latch node QL is changeable when the MSB latch node QM is "1" and the second latch control signal LTH2 is at a high level.

Referring to FIG. 3B, a read operation mode proceeds in order from "00" to "01" to "10", denoted in the right column of FIG. 3B. While transitioning the LSB latch node QL relies on feedback from the MSB latch node QM during the program-verifying operation, the read mode uses feedback from the complement of the MSB latch node QMB to change a state of QL. In the reading mode, the first and third latch control signals LTH1 and LTH3 alternate in accordance with reading cycles (e.g., LTH1 to LTH3 to LTH1), while the second latch control signal LTH2 is held at a low level. The latch outputs QM, QL are initiated at low levels, shown in the left of FIG. 3B, because the latch selection and control signals are disabled at the initial state.

First, in reading the data state "00" (00 RD), the third read voltage VRD3 is applied to the selected wordline WL15 coupled to the selected memory cell M. Because the third read voltage VRD3 is positioned between the distribution profiles of "00" and "01", a memory cell M that has been programmed as "00" becomes conductive. The second latch selection signal SEL2 is also active, and the MSB latch node QM is "0" and the LSB latch node QL is "1" in response to a high-level pulse on the first latch control signal LTH1. At this time, the complementary MSB latch node QMB, which is established as "1", feeds back to the gate of the sixteenth NMOS transistor N16, and the complement of the LSB latch node QLB thereby becomes "0" (QL="1"), the value of which is shown on the right side of FIG. 3B.

When reading the data state "01" (01 RD), the first latch selection signal SEL1 is active with a high level and the second latch selection signal SEL2 is at low level. The third read voltage VRD3 turns the selected memory cell M on (VRD3>$\Delta$VP2), and the latch outputs QM, QL are both "0". Because the second read voltage VRD2 is lower than the third read voltage VRD3 and is interposed between the "01" and "10" levels, it cannot turn the selected memory cell M on. The MSB latch node QM therefore goes to "1" in response to a high-level pulse on the third latch control signal LTH3.

Reading the data state "10" (10 RD) is operable with the second latch selection signal SEL2 at a high level and the first latch selection signal SEL1 at a low level. As noted above, the latch nodes QM, QL are both maintained at "0" when the selected memory cell M is turned on by the application of the third read voltage level VRD3. In addition, the LSB latch node QL is maintained at "0" during the application of the second read voltage level VRD2. However, during application of the first read voltage level VRD1, which is lower than the second read voltage level VRD2, the LSB latch node QL changes to "1". The LSB latch node QL transitions in response to feedback from the complementary MSB latch node QMB, which is applied to the gate of the sixteenth NMOS transistor N16.

An upper margin $\Delta$Un-1 (where n=the number of data states (i.e., 4)), shown in FIG. 1, is the voltage gap between a read voltage VRDn-1 and a corresponding program-verifying voltage VFYn-1. A lower margin $\Delta$Ln-1, also shown in FIG. 1, is the voltage gap between the highest voltage of each distribution profile and the next higher read voltage VRDnA. The program-verifying and reading operations may be more easily carried out when the upper and lower margins are larger. However, the margin limits must also be considered because margins that are too large increase the threshold voltages of the highest distribution profile and also increase read voltages, regardless of program states. A higher read voltage can cause a soft program, which degrades the reliability of data states. Meanwhile, the narrowing of wordline pitches to provide higher integration density, induces capacitance coupling between wordlines and causes a wider spread in the distribution profiles. Adjusting the distribution profiles of threshold voltages is therefore a very important design consideration in a flash memory.

Flash memories may be exposed to various environments because they are used in portable electronic devices such as cell phones, personal digital assistants (PDAs), and other devices. Threshold voltage profiles of the flash memories are sensitive, however, to temperature variation during programming and reading.

FIGS. 4A–4D are graphs illustrating the effect of temperature on programming and reading operations. FIG. 4A shows that there is no problem if the programming and reading operations are performed at the same temperature, regardless of whether it is a high or a low temperature. Specifically, referring to FIG. 4A, the upper and lower margins $\Delta$Un-1, $\Delta$Ln-1, are constant when the programming and reading operations are carried out at the same temperature with fixed program-verifying and reading voltages, regardless of what that temperature is. However, referring to FIGS. 4B through 4D, when the programming and reading operations are carried out at temperatures different from each other, migration of the threshold profiles reduces the margins and causes reading failures.

Referring specifically to FIG. 4B, when the programming operation is performed at a high temperature and the reading operation is performed at a low temperature, the profiles are shifted higher by a threshold voltage amount $\Delta$Vtn after programming. A weak inversion condition causes cell current to flow through a memory cell in proportion to temperature when the control gate of the memory cell is charged up near the program voltage. A high temperature may induce hot electrons and increase the amount of current flowing into the latch/sensing circuits shown in FIG. 2 above a pure cell current amount. During the program-verifying operation, the latch/sensing circuits therefore respond to currents less than cell currents corresponding to the desired threshold profiles. This, in turn, causes a termination of the programming operation before a normal end thereof. As a result, read voltages used at a low temperature need to be higher to generate cell currents identical to those resulting from the programming mode performed at a high temperature.

FIG. 4C illustrates a read operation performed at a high temperature after a program operation performed at a low temperature. In this case, the threshold distribution profiles migrate to the lower side. The high temperature during the read operation induces hot electrons that cause more current to flow into the latch/sensing circuits.

Misalignments between the temperature-dependent threshold profiles and the fixed wordline voltages of program-verifying and reading operations cause malfunctions in the programming and reading operations. And, as shown in FIG. 4D, these misalignments cause the threshold distribution profiles to be spread out on both the lower and higher sides, resulting in instability of establishing and sensing multi-level data states. Because there are limits in the amount by which the reading (and program-verifying) voltage ranges can be extended, and limits in the regulation of the upper and lower margins, fluctuations of voltage profiles due to temperature variations degrade the reliability of multi-bit flash memories.

SUMMARY OF THE INVENTION

An object of the present invention is to provide a multi-level flash memory capable of enhancing operational reliability during temperature variations.

Another object of the present invention is to provide a multi-level flash memory capable of optimizing threshold voltage distribution profiles and voltages for program-verifying and reading despite temperature variations.

Yet another object of the present invention is to provide a multi-level flash memory adaptable to temperature variations.

According to one aspect of the present invention, a multi-level semiconductor memory device includes a plurality of wordlines and bitlines connected to memory cells that store multi-level data. A first circuit supplies a temperature-responsive voltage to a selected wordline to read a state of the memory cell. A second circuit supplies a predetermined voltage to non-selected wordlines. The first circuit preferably includes a semiconductor element having a resistance that varies based on temperature. This embodiment therefore provides reliable program-verifying and reading functions despite migration of threshold voltage distribution profiles from their normal positions due to temperature variations.

BRIEF DESCRIPTION OF THE DRAWINGS

A more complete appreciation of the principles of the present invention, and the attendant advantages thereof, will become readily apparent through the following detailed description of preferred embodiments, made with reference to the accompanying drawings, in which like reference symbols indicate the same or similar components, and wherein:

FIG. 5 is a block diagram of circuits used to generate voltages for programming and reading in a multi-level flash memory according to an embodiment of the invention;

FIGS. 10A through 10F are state diagrams illustrating the establishment of wordline voltages responsive to threshold distribution profile migration due to temperature variations according to principles of the present invention.

DETAILED DESCRIPTION OF PREFERRED EMBODIMENTS

Various embodiments of the invention will now be explained with reference to FIGS. 5 through 11. It should be understood, however, that the following description of preferred embodiments is illustrative only, and should not be taken in a limiting sense. Although specific details are set forth in order to provide a more thorough understanding of the principles of the present invention, it will be apparent to those skilled in the art that those principles may be practiced in any of a number of different ways.

In general, a NAND-type multi-level flash memory includes a memory cell array having a plurality of memory cells. Each of the memory cells can be set in one of four, two-bit data states (i.e., "11", "10", "01", or "00"). Peripheral circuits load data into and sense data from the memory cells. Each memory cell has floating and control gates that are isolated from each other by an insulation film, as well as source and drain regions that are formed in a semiconductor substrate. Erasing memory cell data is performed by applying a high voltage to the substrate while biasing the control gate on a substrate at zero voltage (0V). The erasing operation can, for example, be carried out simultaneously in sector units or on all of the memory cells.

Figure 2:
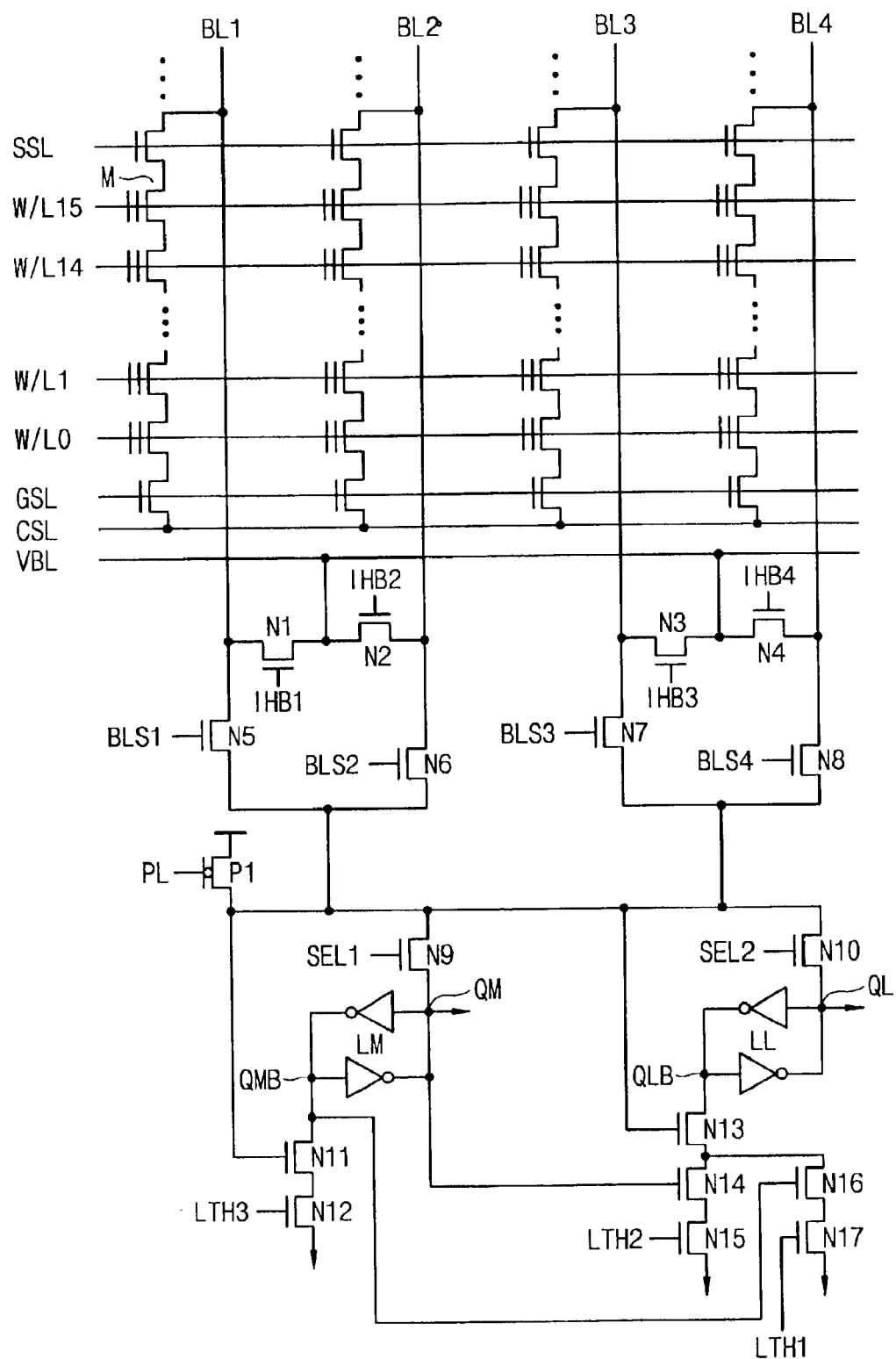
FIG. 2 is a circuit diagram of a core arrangement for reading states of multi-level data according to the prior art.

Programming and reading operations for the four-state/two-bit data of the memory cells has been described previously with reference to FIGS. 2, 3A, and 3B. A programming mode includes a programming operation in which a data bit is written in a selected memory cell and a program-verifying operation that checks the result of the programming operation.

FIG. 5 illustrates an interconnection between circuits for generating voltages to operate the programming and reading modes and the wordline level selection circuits according to an embodiment of this invention. Referring to FIG. 5, a voltage generator 10 outputs a temperature-dependent read/verifying voltage VRVt to be applied to a selected wordline in the memory cell array. A pass voltage generator 50 outputs a predetermined temperature-independent voltage VRVp to be applied to non-selected wordlines during the reading and program-verifying operations. A program voltage generator 60 outputs a program voltage VPGM, predetermined independent of temperature, to be applied to a selected wordline during the programming operation. A program pass voltage generator 70 outputs a program-pass voltage VPASS, also predetermined independent of temperature, to be applied to non-selected wordlines during the programming operation.

A mode selection circuit 80 generates a mode selection signal MS to select an operation mode from among the programming, erasing, and reading modes. The read/verifying voltage VRVt, the read/verifying pass voltage VRVp, the program voltage VPGM, and the program-pass voltage VPASS are applied to the wordline level selection circuits WLS0~WLS15 in common. The wordline level selection circuits WLS0~WLS15 also receive wordline selection signals WS0~WS15 respectively. Each level selection circuit WLS0~WLS15 supplies one of the voltages, VRVt, VRVp, VPGM, or VPASS, to a corresponding wordline as a wordline drive signal based on the mode selection signal MS and its corresponding selection signal WS0~WS15.

Figure 6:
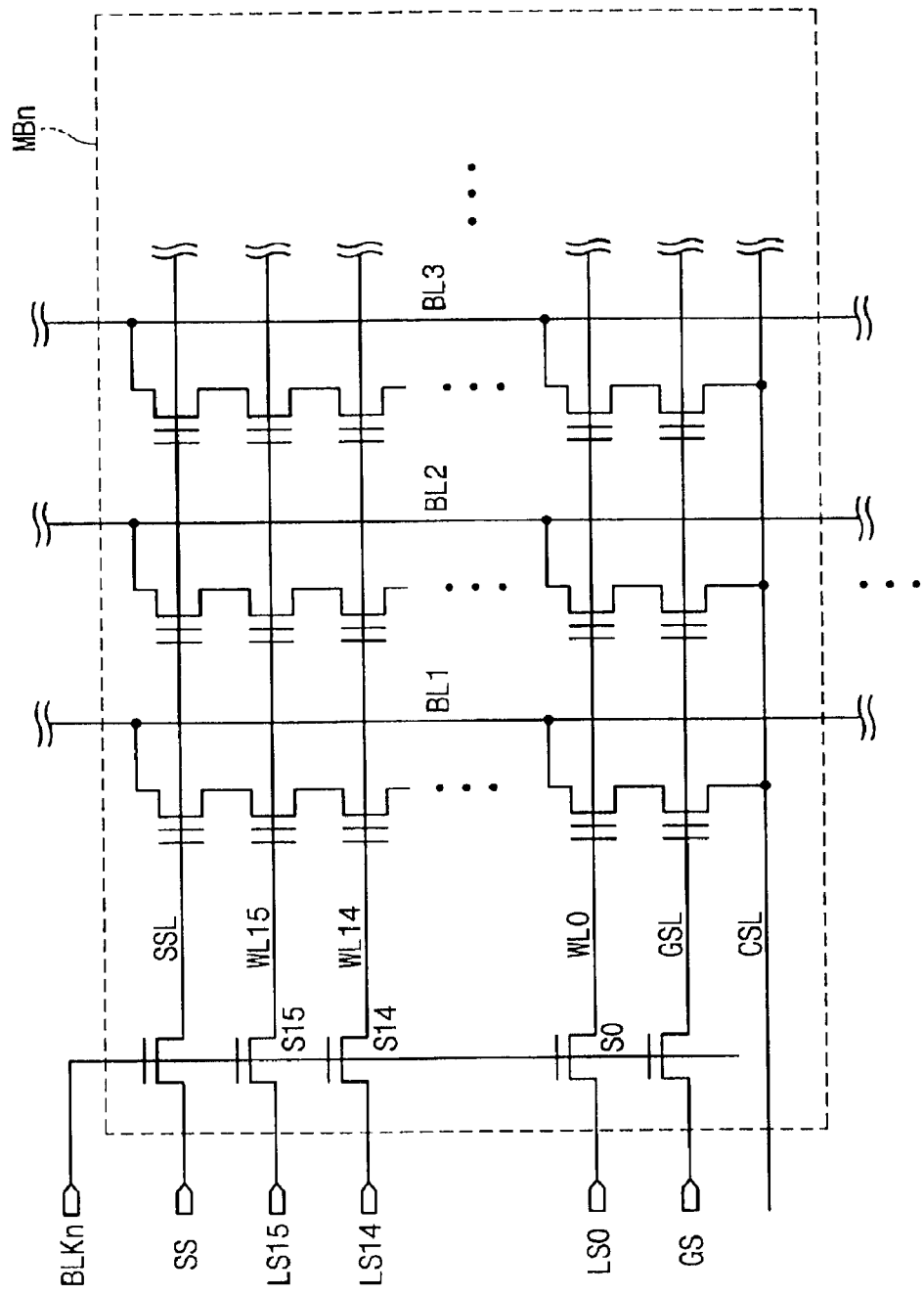
FIG. 6 is a schematic circuit diagram of a unit memory block in a multi-level flash memory configured to receive voltages supplied from the circuit of FIG. 5.

Wordline drive signals LS0~LS15, provided from the wordline level selection circuits WLS0~WLS15, are each transferred to wordlines WL0~WL15 through wordline selection switches S0~S15 (see FIG. 6). The selection switches S0~S15 are simultaneously cut off or placed in a conductive state using a block selection signal BLKn that is assigned to a unit memory cellblock, MBn, as shown in FIG. 6.

Referring to FIGS. 5 and 6, for instance, assuming that the wordline WL15 is selected in the reading mode, the wordline level selection circuit WLS15 selects the read/verifying voltage VRVt from among the voltages to output as its wordline drive signal LS15. The other wordline level selection circuits WLS0~WLS14 output read/verifying pass voltage VRVp as their wordline drive signals LS0~LS14. When the block selection signal BLKn turns the switches S0~S15 on, the selected wordline drive signal LS15 is transferred to the selected wordline WL15 while the other wordline drive signals LS0~LS14 are supplied to the non-selected wordlines WL0~WL14. Also, when the block selection signal BLKn is activated, a string select signal SS is transferred to the string select line SSL, and the ground select signal GS is transferred to the ground select line GSL. In the other unit memory cellblocks (not shown), the block selection signals BLKn prevent the wordline drive signals from being applied to their wordlines.

Table 1 illustrates voltage biasing states applied to wordlines during the various operation modes.

TABLE 1

| | Voltage Biasing States | | |
|---|---|---|---|
| | Reading Mode | Programming Mode | |
| | Read | Program | Program-verifying |
| Selected WL | VRVt (VRD) | VPGM | VRVt (VFY) |
| Non-selected WL | VRVp | VPASS | VRVp |

As can be seen from Table 1, the temperature-dependent voltage VRVt acts as the read voltage VRD during the reading operation mode and operates as the program-verifying voltage VFY during the programming mode.

Figure 7:
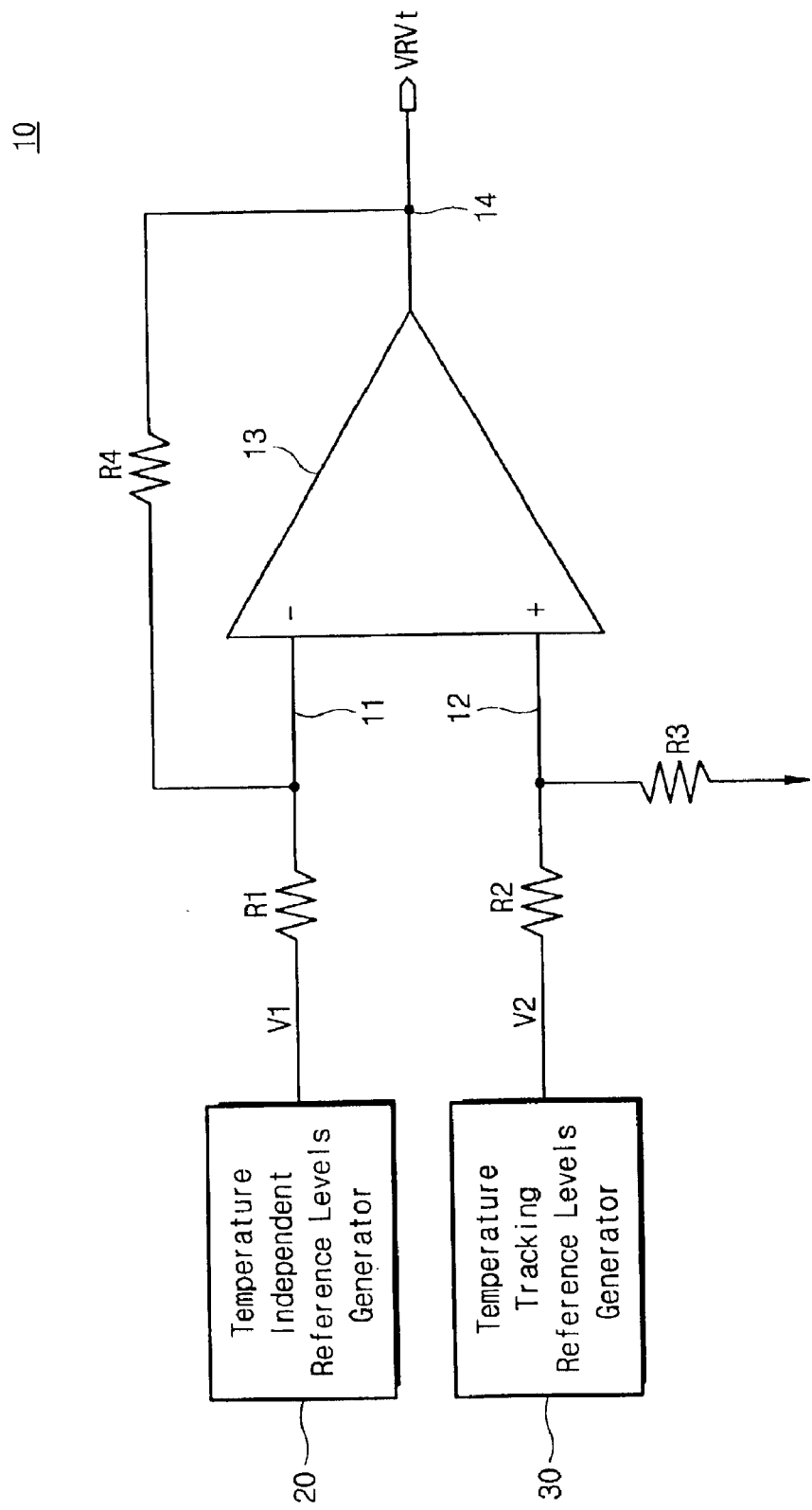
FIG. 7 is a schematic circuit diagram of a read/verifying voltage generating circuit in the multi-level flash memory of FIG. 5.

Referring now to FIG. 7, the read/verifying voltage generator 10 of the multi-level flash memory of FIG. 5 includes a circuit 20 that generates a constant reference voltage V1 and a circuit 30 that generates a flexible reference voltage V2. The constant reference voltage V1 has a fixed level independent of temperature. The flexible reference voltage V2, however, varies in response to temperature variations. The constant reference voltage V1 is applied to an inverted input terminal 11 of a differential amplifier 13 through a first resistor R1, while the flexible reference voltage V2 is applied to an inverted input terminal 12 of the differential amplifier 13 through a second resistor R2. The read/verifying voltage generator 10 further includes a third resistor R3 connected between the non-inverted input terminal of the differential amplifier 13 and a substrate voltage VSS. A fourth resistor R4 is connected between the inverted input terminal 11 and an output terminal 14 of the differential amplifier 13.

The temperature-dependent read/verifying voltage VRVt is generated from the output terminal 14 of the differential amplifier 13. The read/verifying voltage VRVt is established with a level lower than a threshold voltage of an NMOS transistor in the lowest program state (i.e., the data state "10"). In this embodiment, the value of the read/verifying voltage VRVt is preferably obtained by subtracting the constant reference voltage V1 from the flexible reference voltage V2.

Figure 8:
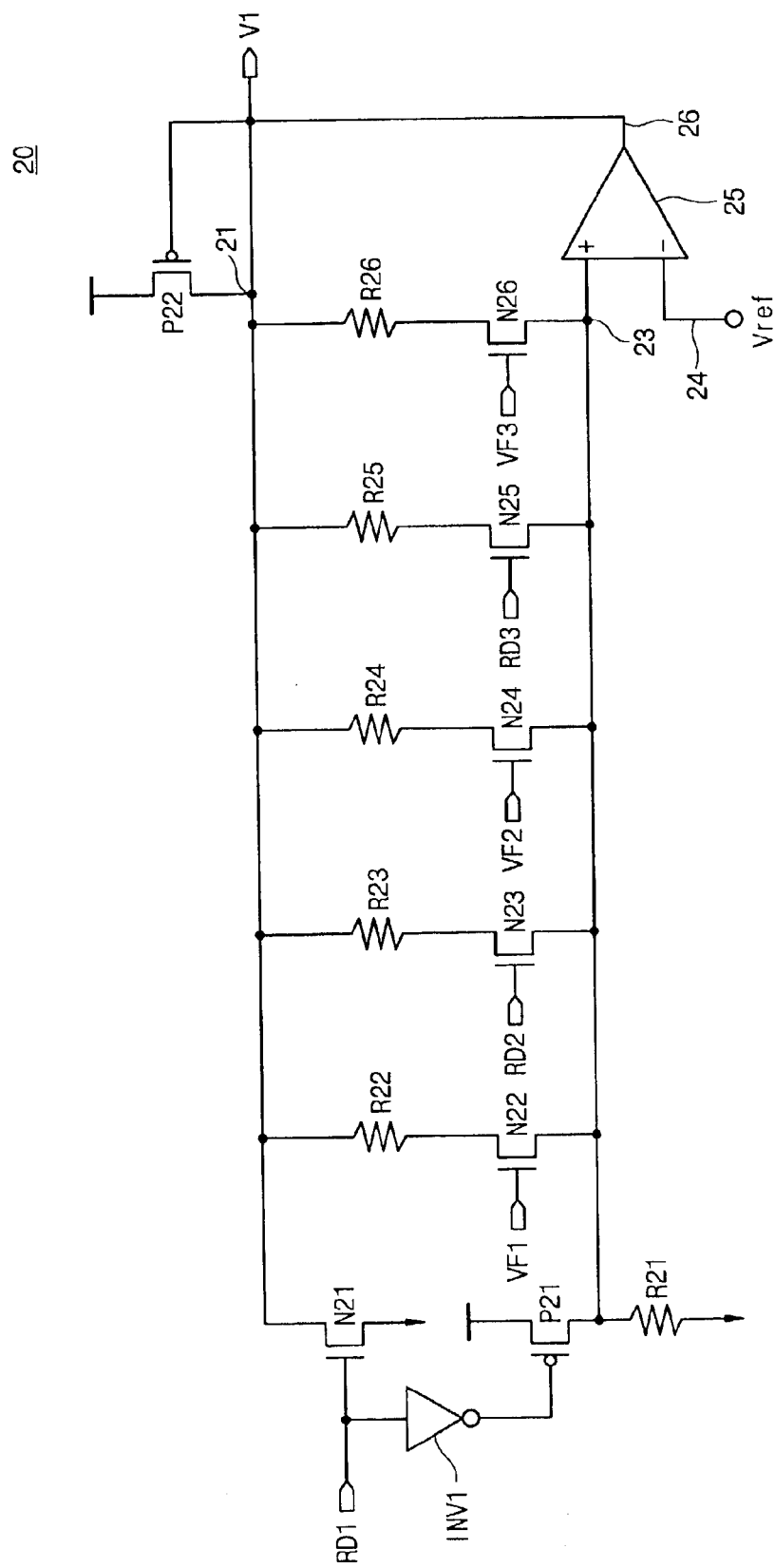
FIG. 8 is a schematic circuit diagram of a constant reference voltage generating circuit 20 of the read/verifying voltage generating circuit of FIG. 7.

Referring now to FIG. 8, the circuit 20 generating the constant reference voltage V1, uses six wordline voltages (e.g., VRD1, VFY1, VRD2, VFY2, VRD3, and VFY3) to generate the four data states. The six wordline voltages, illustrated in FIGS. 4A through 4D, as well as in FIG. 10A, are disposed in the following relation:

VRD1<VFY1<VRD2<VFY2<VRD3<VFY3

Six control signals RD1, VF1, RD2, VF2, RD3, and VF3 are respectively applied to the gates of six NMOS transistors N21~N26 to turn the transistors on or off to generate the constant reference voltage V1 in correspondence with the six wordline voltages. The first read control signal RD1 is applied to a gate of a first NMOS transistor N21 connected between an output terminal 21 and the substrate voltage. The first read control signal RD1 is also applied to a gate of a first PMOS transistor P21, which is connected between a power supply voltage and a non-inverted input terminal 23 of a differential amplifier 25, through an inverter INV1.

Five resistors R22~R26 are connected in parallel to each other, each having a first end connected to the output terminal 21 and a second end connected to a non-inverted input terminal 23 through a source-drain path of a corresponding one of the other five NMOS transistors N22~N26. These resistors R22~R26 are preferably designed with the relationship R22<R23<R24<R25<R26 such that they correspond to the level differences of the wordline voltages for the reading and program-verifying operations. The differential amplifier 25 receives a reference voltage Vref into its inverted input terminal 24 and compares the reference voltage Vref with a comparison voltage received into the non-inverted input terminal 23. The comparison voltage is established by conductive states of the NMOS transistors N22~N26. The differential amplifier 25 applies the comparison result to a gate of a second PMOS transistor P22 via output terminal 26. The constant reference voltage V1 is thereby variably generated at the output terminal 21 in response to sequential activations of the control signals RD1~VF3, corresponding to the six wordline voltages VRD1~VFY3.

Figure 9:
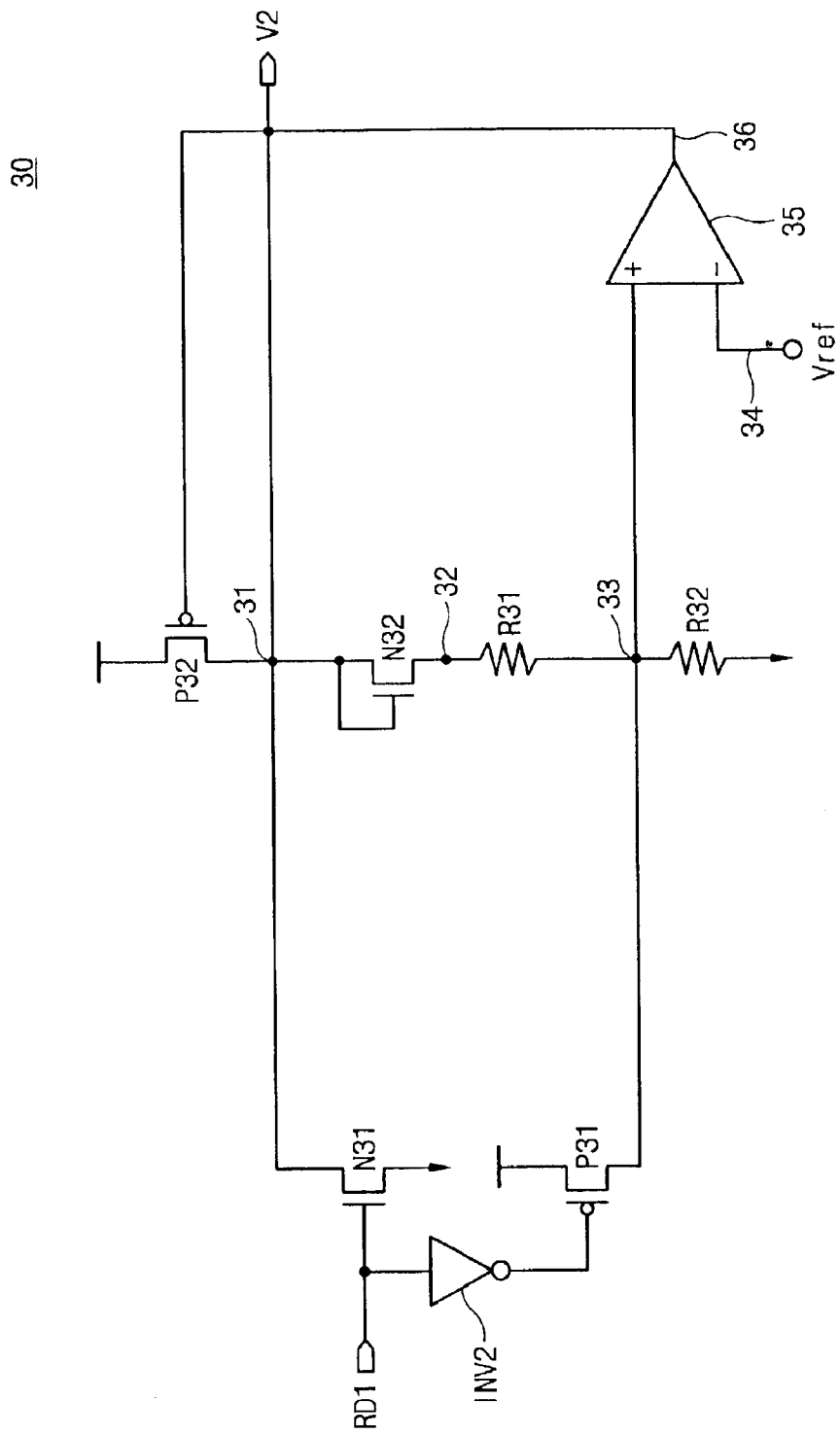
FIG. 9 is a schematic circuit diagram of a flexible reference voltage generating circuit of the read/verifying voltage generating circuit of FIG. 7.

Referring to FIG. 9, a circuit 30 for generating a flexible (temperature-dependent) reference voltage V2 preferably includes a variable NMOS transistor N32 having a threshold voltage that is variable in response to temperature variations. The NMOS transistor N32 is preferably formed of a diode circuit having a gate and a drain coupled together. A first read control signal RD1, having a wordline read voltage VRD1 of 0V, is applied to a gate of a first NMOS transistor N31 connected between an output terminal 31 and the substrate voltage. The first read control signal RD1 is also applied to a gate of a first PMOS transistor P31, which is connected between the power supply voltage and a non-inverted input terminal 33 of a differential amplifier 35, through an inverter INV2. The non-inverted input terminal 33 is connected to the substrate voltage through a resistor R32. A second PMOS transistor P32 is connected between the power supply terminal and the output terminal 31. A gate thereof is coupled to an output terminal 36 of the differential amplifier 35. An inverted input terminal 34 of the differential amplifier 35 is connected to the reference voltage Vref. The diode-coupled NMOS transistor N32 and a first resistor R31 are connected in series between the output terminal 31 and the non-inverted input terminal 33.

In the flexible reference voltage generator 30, because the negative feedback loop for the differential amplifier 35 is formed through the second PMOS transistor P32, the diode-connected NMOS transistor N32, the first resistor R31, and the second resistor R32, it sets a value of V2 at the point in time when voltage levels of the inverted and non-inverted input terminals 34, 33 are equal to each other. V2 is always higher than a voltage at a node 32 by an amount of the threshold voltage Vth of the diode-connected NMOS transistor N32. A steady current flows through the second resistor R32 connected between the non-inverted input terminal 33 and the substrate voltage.

Since the threshold voltage and a channel resistance of the diode-connected NMOS transistor N32 decrease in response to an increase of temperature, more current flows into the non-inverted input terminal 33 at higher temperatures to elevate a voltage level thereof. A reduced channel current in the second PMOS transistor P32 lowers the output voltage V2 proportionally. Referring to FIGS. 7–9, the lowered output voltage V2 from the variable voltage generation circuit 30 is compared with the constant reference voltage V1 from the constant voltage generation circuit 20 in the differential amplifier 13 (V2−V1). The final temperature-dependent voltage VRVt is therefore generated with a voltage level lowered by an amount that is proportional to the elevation in temperature.

If a temperature decreases, on the other hand, an increased threshold voltage and channel resistance of the diode-connected NMOS transistor N32 reduce the amount of current flowing into the non-inverted input terminal 33 of the differential amplifier 35. This, in turn, reduces a voltage at the non-inverted input terminal 33. As a result, a channel current in the second PMOS transistor P32 increases and the variable output voltage V2 thereby increases proportionally. This increased output voltage V2 increases the final temperature-dependent voltage VRVt because of the comparison of this voltage V2 to the constant reference voltage V1 (V2−V1) in the differential amplifier 13 of the read/verifying voltage generator 10.

More channel current Ids flows through the diode-coupled NMOS transistor N32 at a high temperature T1 than at a low temperature T2 in a weak inversion state. This relationship is represented in the graph shown in FIG. 11, which plots the relationship between drain-to-source current Ids and gate voltage Vg in the diode-connected transistor N32 of the flexible reference voltage generating circuit 30 of FIG. 9. In a strong inversion region with a higher gate voltage, however, the low temperature T2 induces more current in the channel of the NMOS transistor N32 than the high temperature does. It may therefore be possible to arrange the gate voltage Vg of the NMOS transistor N32 at a voltage level VT that causes the NMOS transistor N32 to operate in the weak inversion environment of temperature variations.

Figure 10E:
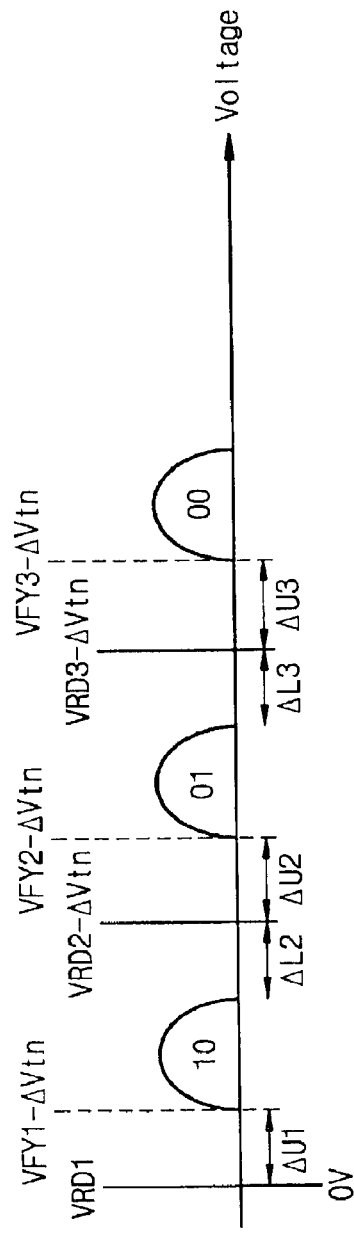

FIGS. 10A through 10F illustrate the establishment of wordline voltages responsive to threshold distribution profile migration due to temperature variations according to principles of the present invention. Referring to FIGS. 10A–10F, the first read wordline voltage VRD1 for the lowest data state "01" is fixed at 0V. Referring specifically to FIG. 10A, distribution profiles for programming and reading operations performed at room temperature are not shifted because there is no temperature variation. Referring to FIG. 10B, however, at high temperature, the voltage distribution profiles are shifted lower in their entirety by an amount ΔVtn equal to a threshold voltage of the NMOS transistor, for example, because of high temperature activation of the transistor. Thus, although the upper margin (a gap between VRD1 and the lowest threshold voltage of the profile "10") is decreased for the data state "10", the wordline voltages for program-verifying and reading operations are generated having levels lowered by an amount ΔVtn using the circuit of FIG. 7. More particularly, VFY1 is shifted to VFY1−ΔVtn, VRD2 to VRD2−ΔVtn, VFY2 to VFY2−ΔVtn, VRD3 to VRD3−ΔVtn, and VFY3 to VFY3−ΔVtn.

Referring now to FIG. 10C, when programming at a high temperature and reading at a low temperature, the widths of the threshold distribution profiles increase. For example, ΔU1 increases by an amount ΔVtn. Since the flexible reference voltage V2 increases in proportion to the temperature elevation, the wordline voltages are optimized in correspondence with the migration of the profiles. More particularly, VFY1 shifts to VFY1+ΔVtn, VRD2 to VRD2+ΔVtn, VFY2 to VFY2+ΔVtn, VRD3 to VRD3+ΔVtn, and VFY3 to VFY3+ΔVtn.

Referring to FIG. 10D, the entire threshold distribution profiles increase at a low temperature by an amount ΔVtn, for example, because of the influence of low temperature. Thus, although the low temperature widens the upper margin for the data state "10", the wordline voltages for program-verifying and reading are also generated having higher levels by an amount ΔVtn using the circuit shown in FIG. 7. More particularly, VFY1 is adjusted to VFY1+ΔVtn, VRD2 to VRD2+ΔVtn, VFY2 to VFY2+ΔVtn, VRD3 to VRD3+ΔVtn, and VFY3 to VFY3+ΔVtn.

Figure 10F:
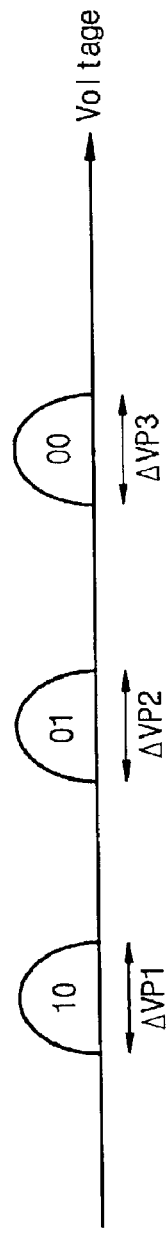
Figure 11:
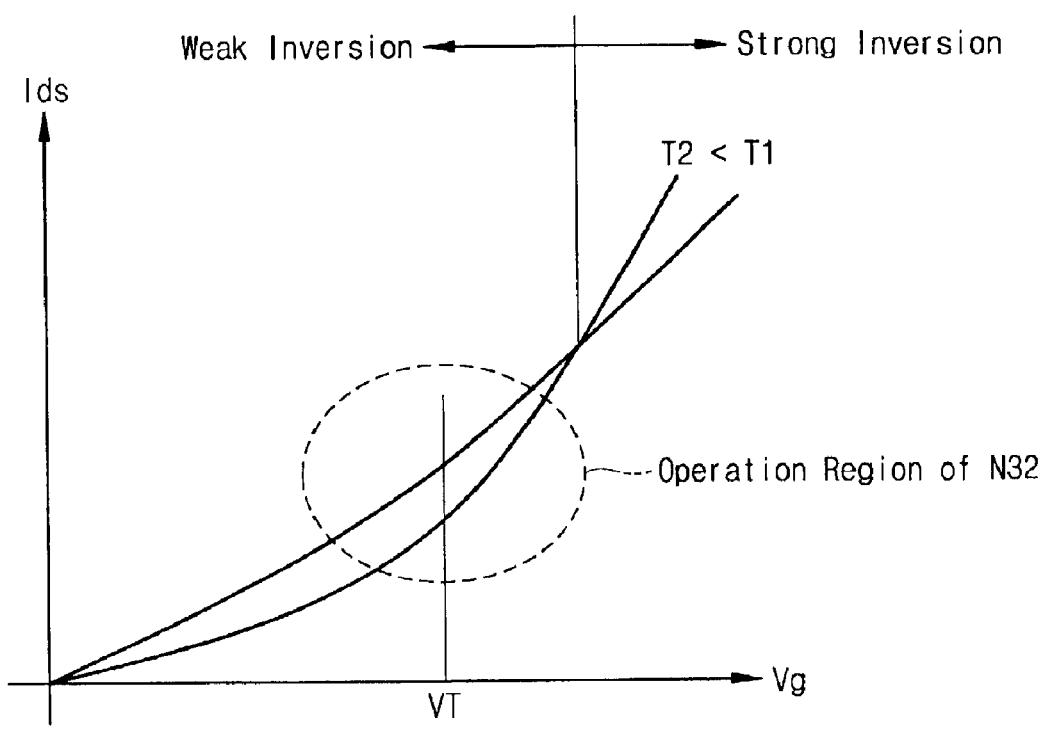
FIG. 11 is a graph illustrating a characteristic of the NMOS transistor N32 of the flexible reference voltage generator of FIG. 9.

Finally, referring to FIG. 10E, when programming at a low temperature and reading at a high temperature, the threshold distribution profiles are shifted lower in their entirety by an amount ΔVtn. As ΔU1 becomes narrower, wordline voltages are optimized in relation to the migration of the profiles, such that VFY1 shifts to VFY1−ΔVtn, VRD2 to VRD2−ΔVtn, VFY2 to VFY2−ΔVtn, VRD3 to VRD3−ΔVtn, and VFY3 to VFY3−ΔVtn. Consequently, as shown in FIG. 10F, the threshold distribution profiles corresponding to the data states are substantially settled in normal positions without widening (as occurred in the example shown in FIG. 4D).

As described above, although temperature variations or transitions in programming and reading multi-level data states cause virtual migrations of threshold distribution profiles in sensing the data states, the principles of this invention can be used to optimize wordline voltages based on the present condition of the distribution profiles. A multi-level flash memory constructed according to the principles of the invention can therefore assure the reliability of memory operations in spite of temperature variations.

Although preferred embodiments of the present invention have been disclosed for illustrative purposes, those skilled in the art will appreciate that various modifications, additions, and substitutions are possible, without departing from the scope and spirit of the invention as claimed.

What is claimed is:

1. A semiconductor memory device comprising:
    a plurality of memory cells configured to store multi-level data;
    a plurality of wordlines connected to the plurality of memory cells; and
    a first circuit configured to supply a temperature-dependent voltage to a selected one of the wordlines to read or verify a state of a selected memory cell, wherein the first circuit includes a first voltage generation circuit configured to supply a temperature-independent reference voltage and a second voltage generation circuit configured to supply a flexible reference voltage, the first circuit further includes a differential amplifier configured to compare the temperature-independent reference voltage with the flexible reference voltage.

2. The semiconductor memory device according to claim 1, further comprising a second circuit configured to supply predetermined voltages to non-selected wordlines to read or verify a state of the selected memory cell.

3. The semiconductor memory device according to claim 1, wherein the first circuit comprises a variable resistance semiconductor element configured to respond to temperature variations.

4. The semiconductor memory device according to claim 1, wherein an output of the differential amplifier supplies the temperature-dependent voltage to the selected one of the wordlines.

5. The semiconductor memory device according to claim 1, wherein a voltage level of the temperature-dependent voltage is approximately equal to a voltage level of the flexible reference voltage minus a voltage level of the reference voltage.

6. The semiconductor memory device according to claim 1, wherein the flexible reference voltage is configured to vary based on temperature variations.

7. The semiconductor memory device according to claim 6, wherein the second voltage generation circuit comprises a variable resistance semiconductor element configured to respond to temperature variations.

8. A semiconductor memory device comprising:

a memory cell array comprising a plurality of memory cells, wordlines, and bitlines, said memory cells configured to store multi-level data;

a first voltage generation circuit configured to generate a temperature-independent first voltage having a predetermined level;

a second voltage generation circuit configured to generate a temperature-dependent flexible reference voltage; and a third circuit configured to compare the temperature-independent first voltage to the flexible reference voltage, said third circuit further configured to supply a temperature-dependent output voltage to a selected one of the wordlines, said output voltage corresponding to a difference between the temperature-independent first voltage and the flexible reference voltage.

9. The semiconductor memory device according to claim 8, further comprising a fourth circuit configured to supply voltages having predetermined levels to nonselected wordlines.

10. The semiconductor memory device of claim 8, wherein the second voltage generation circuit comprises a variable-resistance semiconductor element that responds to temperature variations.

11. The semiconductor memory device of claim 8, wherein the third circuit comprises a differential amplifier configured to receive an input corresponding to the temperature-independent first voltage into a first input terminal thereof, to receive an input corresponding to the flexible reference voltage into a second input terminal thereof, and to output the output voltage from an output terminal thereof.

12. The semiconductor memory device of claim 11, wherein the third circuit further comprises a first resistance element coupled between the first input terminal and the first voltage generation circuit and a second resistance element coupled between the second input terminal and the second voltage generation circuit.

13. A method of operating a multi-level data state semiconductor memory device having a plurality of wordlines connected to a plurality of memory cells, said method comprising:

selecting a wordline from among a plurality of wordlines, said selected wordline corresponding to a selected memory cell;

generating a temperature-independent fixed reference voltage and a temperature-dependent flexible reference voltage;

comparing the temperature-independent fixed reference voltage with the temperature-dependent flexible reference voltage to generate a temperature-dependent voltage;

supplying the temperature-dependent voltage to the selected wordline; and supplying predetermined voltages to nonselected wordlines.

14. The method according to claim 13, further comprising reading a data state of the selected memory cell.

15. The method according to claim 13, further comprising verifying a program state of the selected memory cell.

16. The method according to claim 13, wherein supplying predetermined voltages to nonselected wordlines comprises supplying a pass voltage to nonselected wordlines.

* * * * *

UNITED STATES PATENT AND TRADEMARK OFFICE
CERTIFICATE OF CORRECTION

PATENT NO.    : 6,870,766 B2
DATED         : March 22, 2005
INVENTOR(S)   : Cho et al.

Figure 1:
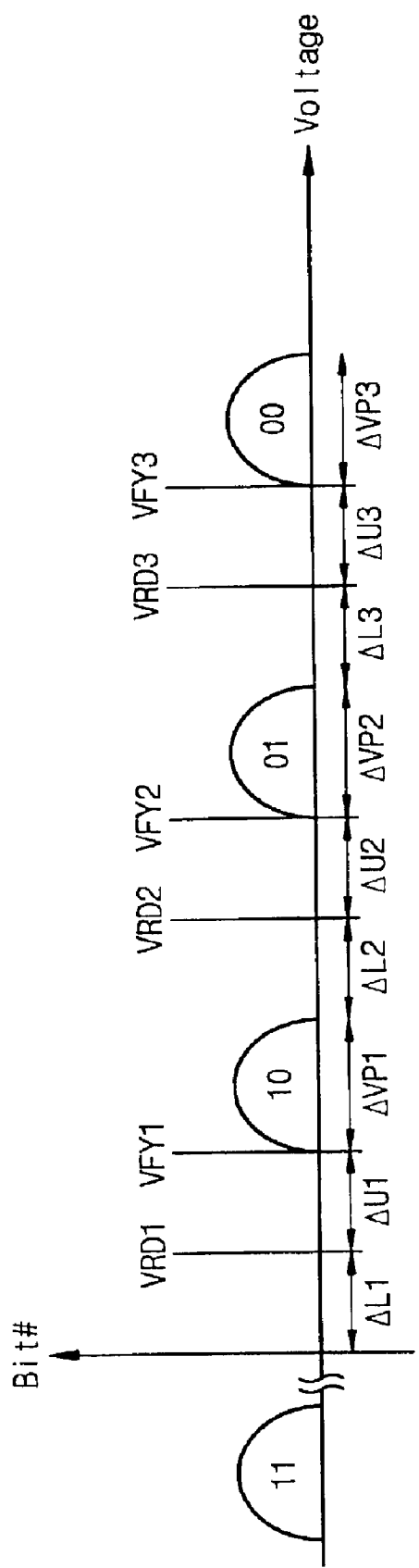
FIG. 1 is a state diagram showing distribution profiles of threshold voltages for the various data states in a conventional multi-level flash memory.
Figure 3A:
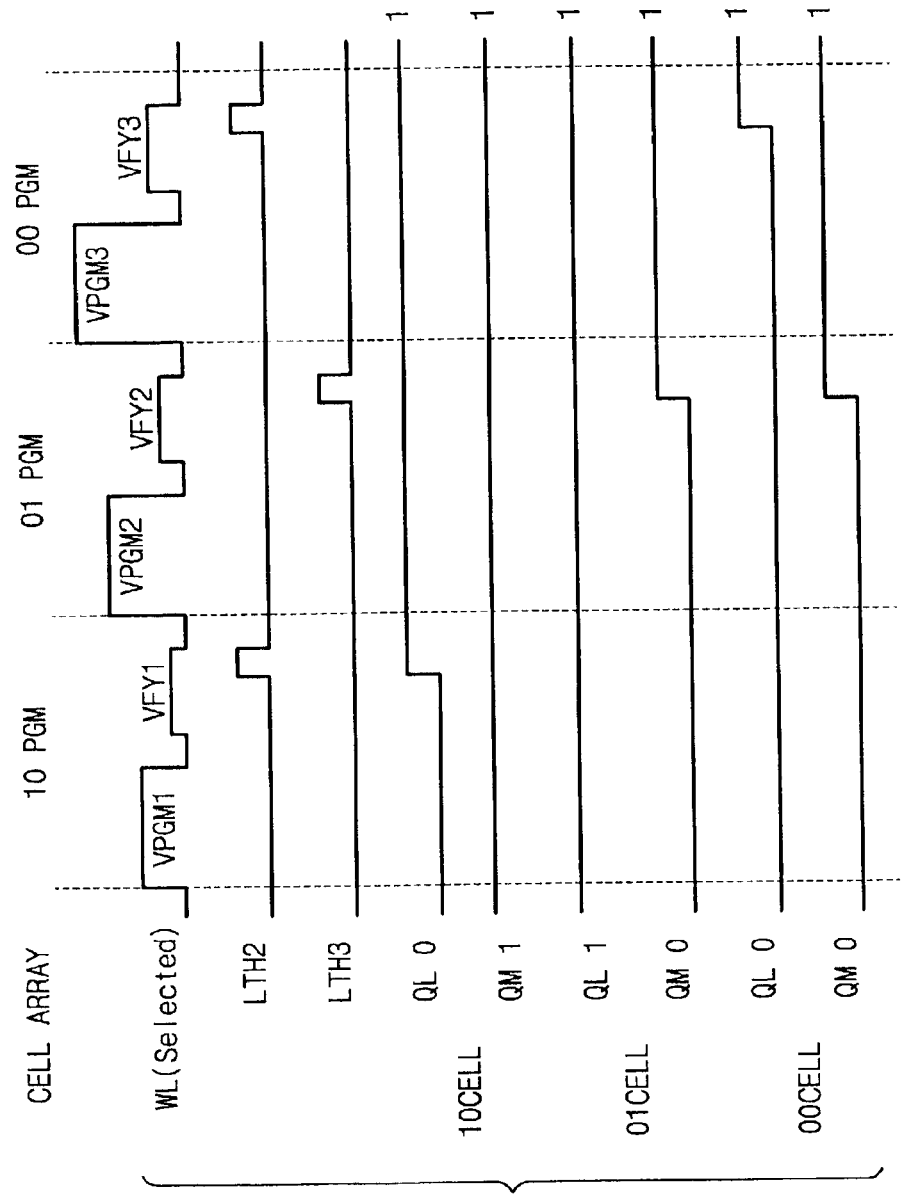
FIGS. 3A and 3B are timing diagrams of signals used in programming and reading operations in the circuit of FIG. 2.
Figure 3B:
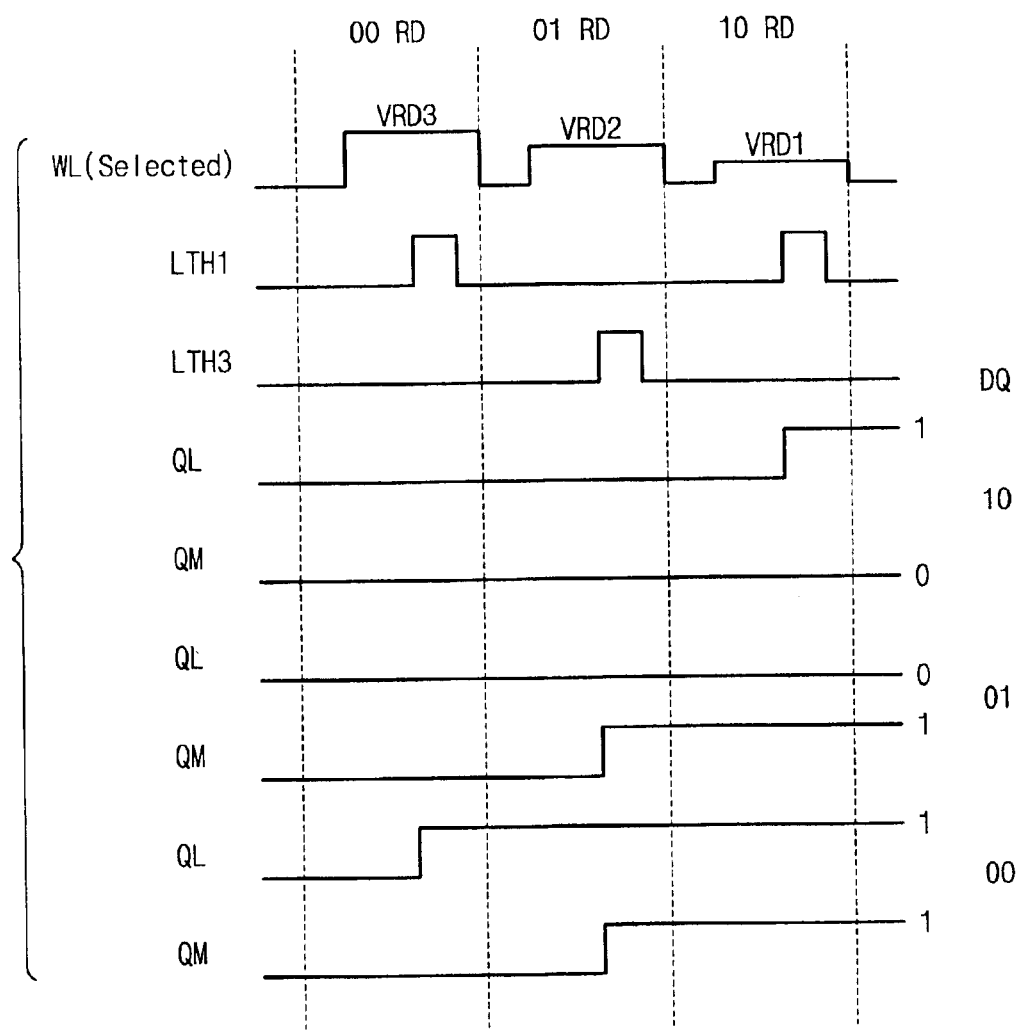
Figure 4A:
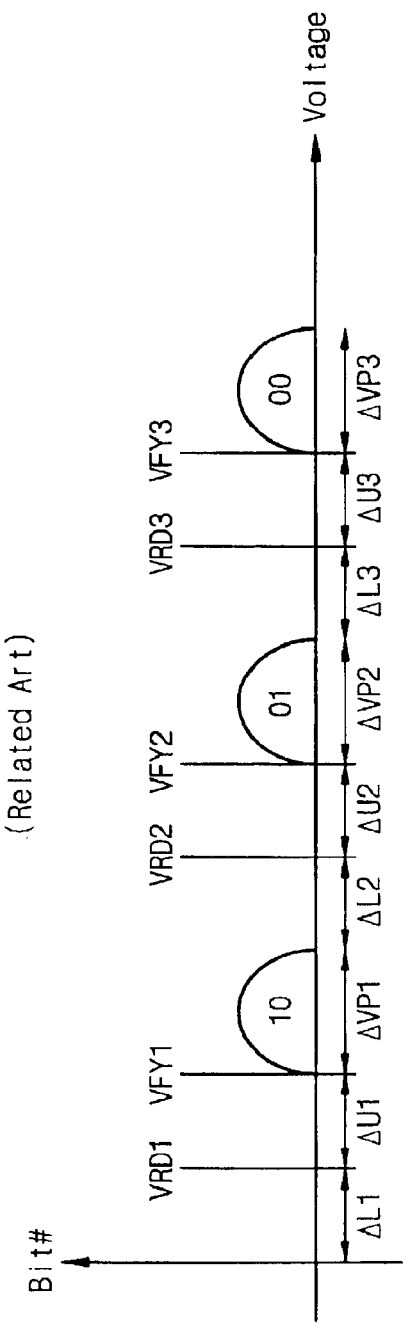
FIGS. 4A through 4D are state diagrams illustrating program-verifying and reading failures as a result of temperature variations in a conventional flash memory device.
Figure 4B:
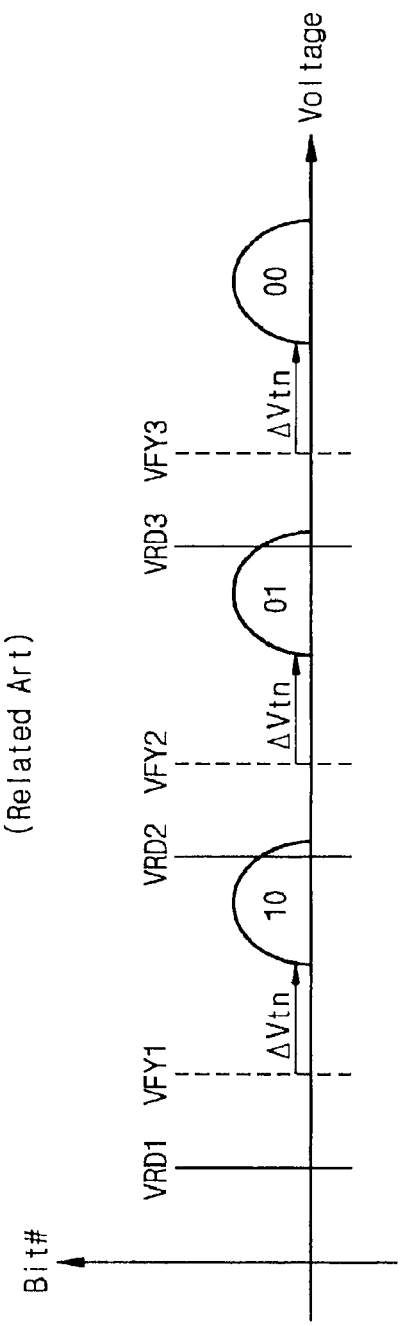
Figure 4C:
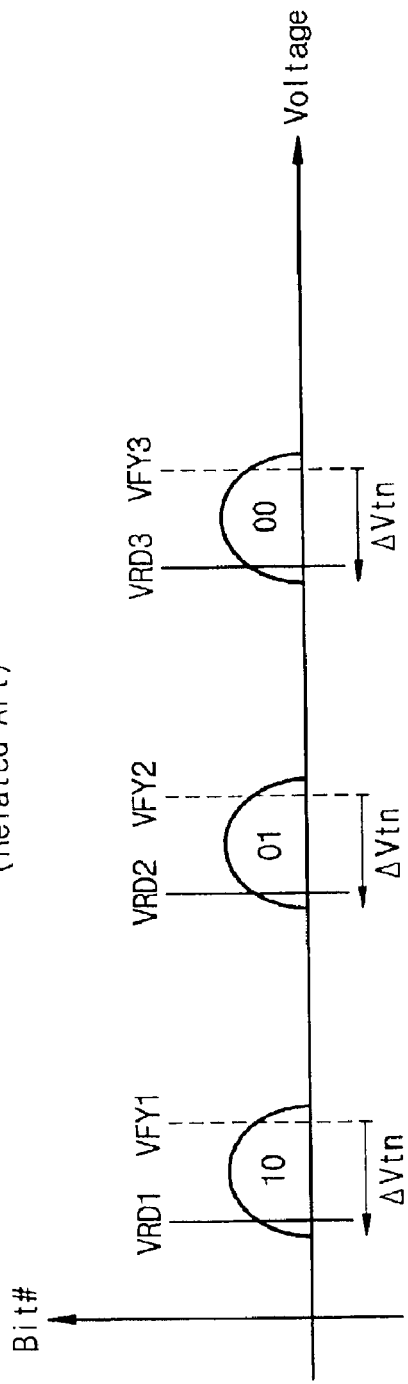
Figure 4D:
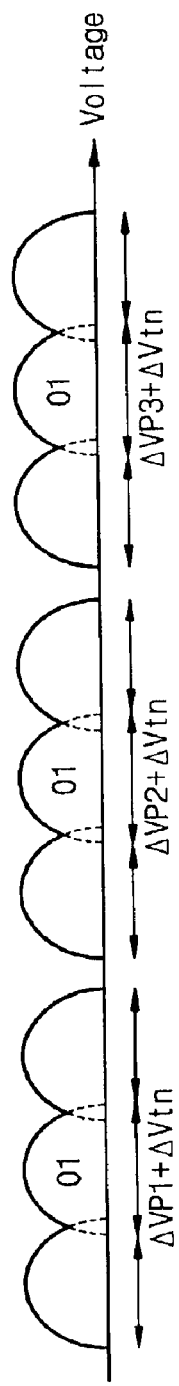

It is certified that error appears in the above-identified patent and that said Letters Patent is hereby corrected as shown below:

<u>Column 1,</u>
Line 50, delete "FIGS. 1 and 3A," and insert -- FIGS. 1, and 3A, --.

<u>Column 7,</u>
Line 47, delete "terminal of" and insert -- terminal 12 of --.

Signed and Sealed this

Fourth Day of April, 2006

JON W. DUDAS
*Director of the United States Patent and Trademark Office*